United States Patent
Jagannathan et al.

(10) Patent No.: US 10,256,161 B2
(45) Date of Patent: Apr. 9, 2019

(54) DUAL WORK FUNCTION CMOS DEVICES

(71) Applicant: International Business Machines Corporation, Armonk, NY (US)

(72) Inventors: Hemanth Jagannathan, Niskayuna, NY (US); Muthumanickam Sankarapandian, Niskayuna, NY (US); Koji Watanabe, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 40 days.

(21) Appl. No.: 15/045,778

(22) Filed: Feb. 17, 2016

(65) Prior Publication Data
US 2017/0236759 A1   Aug. 17, 2017

(51) Int. Cl.
| H01L 21/84 | (2006.01) |
| H01L 21/8238 | (2006.01) |
| H01L 27/12 | (2006.01) |
| H01L 29/51 | (2006.01) |

(52) U.S. Cl.
CPC .... H01L 21/845 (2013.01); H01L 21/823821 (2013.01); H01L 21/823842 (2013.01); H01L 27/1211 (2013.01); H01L 29/513 (2013.01)

(58) Field of Classification Search
None
See application file for complete search history.

(56) References Cited

U.S. PATENT DOCUMENTS

| 6,693,313 | B2 | 2/2004 | Gonzalez et al. |
| 7,378,713 | B2 | 5/2008 | Hsu et al. |
| 7,754,594 | B1 | 7/2010 | Chudzik et al. |
| 9,202,698 | B2 | 12/2015 | Jagannathan et al. |
| 9,343,372 | B1 * | 5/2016 | Bao ........................ H01L 29/401 |
| 9,530,778 | B1 * | 12/2016 | Lin ........................ H01L 27/0922 |
| 2007/0075351 | A1 | 4/2007 | Schulz et al. |
| 2007/0178634 | A1 | 8/2007 | Jung et al. |

(Continued)

OTHER PUBLICATIONS

D. G. Schlom et al., "Gate Oxides Beyond SiO2," MRS Bulletin, vol. 33, 2008, pp. 1017-1025.
(Continued)

*Primary Examiner* — Walter H Swanson
*Assistant Examiner* — Kien C Ly
(74) *Attorney, Agent, or Firm* — Cantor Colburn LLP; Vazken Alexanian

(57) ABSTRACT

A method for forming a semiconductor device includes forming a first channel region and a second channel region on a substrate, depositing a dielectric material layer on the first channel region and the second channel region, and depositing a barrier layer on the dielectric material layer on the first channel region and the second channel region. A metal layer is deposited on the barrier layer on the first channel region and the second channel region. A portion of the metal layer and the barrier layer on the first channel region and a portion of the metal layer on the second channel region are removed to expose the barrier layer on the second channel region. A layer of workfunction material is deposited on an exposed portion of the dielectric material layer on the first channel region and over the barrier layer on the second channel region.

3 Claims, 14 Drawing Sheets

(56) References Cited

U.S. PATENT DOCUMENTS

| | | | |
|---|---|---|---|
| 2010/0213553 A1* | 8/2010 | Hargrove | H01L 21/28167 257/410 |
| 2010/0224938 A1 | 9/2010 | Zhu | |
| 2013/0260549 A1* | 10/2013 | Jagannathan | H01L 21/28518 438/592 |
| 2014/0231922 A1* | 8/2014 | Kim | H01L 29/401 257/369 |
| 2016/0086860 A1* | 3/2016 | Kannan | H01L 21/823842 438/592 |
| 2016/0336194 A1* | 11/2016 | Yeh | H01L 21/321 |

OTHER PUBLICATIONS

I. Ferain et al., "Metal gate thickness optimization for MuGFET performance improvement," 38th European Solid-State Device Research Conference, ESSDERC, 2008, pp. 202-205.

K. Choi et al., "The effect of metal thickness, overlayer and high-k surface treatment on the effective work function of metal electrode," Proceedings of 35th European Solid-State Device Research Conference, 2005, pp. 101-104.

M. M. Hussain et al., "Gate-First Integration of Tunable Work Function Metal Gates of Different Thicknesses Into High-k /Metal Gates CMOS FinFETs for Multi-VTh Engineering," IEEE Transactions on Electron Devices, vol. 57, Issue 3, 2010, pp. 626-631.

R. Singanamalla et al., "On the impact of TiN film thickness variations on the effective work function of poly-Si/ TiN/SiO2 and poly-Si/TiN/HfSiON gate stacks," IEEE Electron Device Letters, vol. 27, No. 5, 2006, pp. 332-334.

T. Matsukawa et al., "Dual metal gate FinFET integration by Ta/Mo diffusion technology for Vt reduction and multi-Vt CMOS application," 38th European Solid-State Device Research Conference, ESSDERC, 2008, pp. 282-285.

* cited by examiner

DUAL WORK FUNCTION CMOS DEVICES

BACKGROUND

The present invention generally relates to complimentary metal-oxide semiconductors (CMOS) and metal-oxide-semiconductor field-effect transistors (MOSFET), and more specifically, to finFET device fabrication.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

The finFET is a type of MOSFET. The finFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Since the fin provides a three dimensional surface for the channel region, a larger channel length may be achieved in a given region of the substrate as opposed to a planar FET device.

Gate spacers form an insulating film along the gate sidewalls. Gate spacers may also initially be formed along sacrificial gate sidewalls in replacement gate technology. The gate spacers are used to define source/drain regions in active areas of a semiconductor substrate located adjacent to the gate.

Device scaling drives the semiconductor industry, which reduces costs, decreases power consumption, and provides faster devices with increased functions per unit area. Improvements in optical lithography have played a major role in device scaling. However, optical lithography has limitations for minimum dimensions, which are determined by the wavelength of the irradiation.

It is often desirable to form gate stacks in MOSFET devices from different materials so that the nFET device and the pFET device have different characteristics such as different threshold voltages.

SUMMARY

According to an embodiment of the present invention, a method for forming a semiconductor device includes forming a first channel region and a second channel region on a substrate, and depositing a dielectric material layer on the first channel region and the second channel region. The method further includes depositing a barrier layer on the dielectric material layer on the first channel region and the second channel region, depositing a metal layer on the barrier layer on the first channel region and the second channel region, and depositing a cap layer on the metal layer on the first channel region and the second channel region. Once the cap layer is deposited, a portion of the cap layer, the metal layer, and the barrier layer on the first channel region and a portion of the cap layer and the metal layer on the second channel region are removed to expose the barrier layer on the second channel region. A layer of workfunction material is deposited material on an exposed portion of the dielectric material layer on the first channel region and over the barrier layer on the second channel region.

According to another embodiment of the present invention, a method for forming a semiconductor device includes forming a first channel region and a second channel region on a substrate, depositing a dielectric material layer on the first channel region and the second channel region, and depositing a barrier layer on the dielectric material layer on the first channel region and the second channel region. A metal layer is deposited on the barrier layer on the first channel region and the second channel region. A portion of the metal layer and the barrier layer on the first channel region and a portion of the metal layer on the second channel region are removed to expose the barrier layer on the second channel region. A layer of workfunction material is deposited on an exposed portion of the dielectric material layer on the first channel region and over the barrier layer on the second channel region.

According to yet another embodiment of the present invention, a semiconductor device includes a first channel region and a second channel region. A first gate stack is arranged on the first channel region, the first gate stack includes a dielectric material layer, a layer of workfunction material arranged on the dielectric material layer, and a gate conductor metal arranged on the layer of workfunction material. A second gate stack is arranged on the second channel region. The second gate stack includes the dielectric material layer, a barrier layer arranged on the dielectric material layer, the layer of workfunction material arranged on the barrier layer, and a gate conductor metal arranged on the layer of workfunction material.

BRIEF DESCRIPTION OF THE DRAWINGS

FIG. 1 illustrates a side view of a semiconductor-on-insulator (SOI) wafer.

FIG. 2 illustrates a side view following the formation of fins on the insulator layer.

FIG. 3 illustrates a top view of the fins arranged on the insulator layer.

FIG. 4 illustrates a side view following the formation of a sacrificial (dummy) gates over portions of the fins.

FIG. 5 illustrates a top view following the formation of spacers adjacent to the sacrificial gates.

FIG. 6 illustrates a top view of the resultant structure following the formation of source/drain regions.

FIG. 7 illustrates a partially cut-away view along the line A-A (of FIG. 6) of the source/drain regions and the fins.

FIG. 8 illustrates a top view following the formation of an inter-level dielectric layer (ILD).

FIG. 9 illustrates a cut-away view along the line A-A (of FIG. 8) showing the inter-level dielectric layer arranged over portions of the insulator layer and the source/drain regions.

FIG. 10 illustrates a top view of the resultant structure following the removal of the sacrificial gates (of FIG. 8) to form cavities that expose the channel regions.

FIG. 11 illustrates a cut-away view along the line B-B (of FIG. 10) of the channel regions following the removal of the sacrificial gates.

FIG. 12 illustrates a cut-away perpendicular to the longitudinal axis of the channel regions following the deposition of replacement metal gate materials.

FIG. 13 illustrates a cut-away perpendicular to the longitudinal axis of the channel regions following the patterning of a mask.

FIG. 14 illustrates a cut-away perpendicular to the longitudinal axis of the channel regions following an etching process.

FIG. 15 illustrates a cut-away perpendicular to the longitudinal axis of the channel regions following the removal of the mask and a selective etching process.

FIG. 16 illustrates a cut-away perpendicular to the longitudinal axis of the channel regions following the deposition of a workfunction metal.

FIG. 17 illustrates a top view following the formation of the replacement metal gate stacks.

FIG. 18 illustrates a cut-away view along the line C-C (of FIG. 17).

FIG. 19 illustrates a cut-away view along the line D-D (of FIG. 17).

FIG. 20 illustrates a cut-away perpendicular to the longitudinal axis of the channel regions that is similar to FIG. 12.

FIG. 21 illustrates a cut-away perpendicular to the longitudinal axis of the channel regions following the patterning of a mask.

FIG. 22 illustrates a cut-away perpendicular to the longitudinal axis of the channel regions following an etching process.

FIG. 23 illustrates a cut-away perpendicular to the longitudinal axis of the channel regions following the removal of the mask.

FIG. 24 illustrates a cut-away perpendicular to the longitudinal axis of the channel regions following the deposition of the workfunction.

FIG. 25 illustrates a top view following the formation of the replacement metal gate stacks.

FIG. 26 illustrates a cut-away view along the line C-C (of FIG. 25).

FIG. 27 illustrates a cut-away view along the line D-D (of FIG. 25).

DETAILED DESCRIPTION

In MOSFET devices, it is often desirable to form gate stacks in MOSFET devices from different materials so that the nFET device and the pFET device have different characteristics such as different threshold voltages (dual threshold voltages). One method for achieving devices with dual threshold voltages is to form gate stacks having different work function metals and/or different dielectric materials. In multi-gate devices such as, finFET devices, the formation of devices having different gate stack arrangements has become more challenging because the gate lengths have become shorter.

Shorter gate lengths may cause a reduction in the performance of such devices when formed using previous replacement metal gate fabrication methods due to metal gate pinch-off, metal gate residue, and damage to the gate materials during patterning. Such challenges may result in undesirable variations in threshold voltage and undesirable gate leakage current.

FIGS. 1-19 illustrate an exemplary method for fabricating an exemplary multi-gate FET device.

Figure 1:
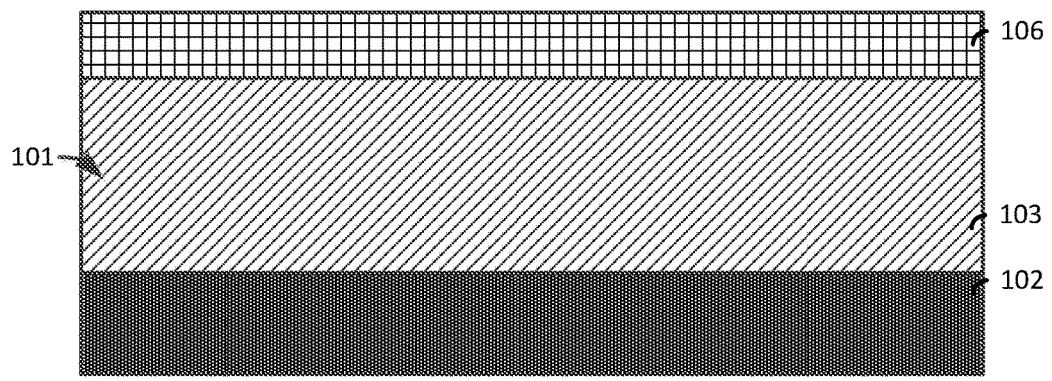
FIGS. 1-19 illustrate an exemplary method for fabricating an exemplary multi-gate FET device.

FIG. 1 illustrates a side view of a semiconductor-on-insulator (SOI) wafer 101. The SOI wafer 101 includes an insulator layer 102 and a semiconductor substrate 103 arranged on the insulator layer 102. The SOI wafer 101 can be formed by any suitable technique such as, for example wafer bonding, Smartcut™, SIMOX (Separation by IMplanted Oxygen).

The semiconductor substrate 103 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

The insulator layer 102 may include, for example, a buried oxide (BOX) material or other suitable insulator materials. Examples of suitable insulator materials include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The thickness of insulator layer 102 generally varies and is not intended to be limited. In one aspect, the thickness of the insulator layer 102 is in a range from about 10 nm to about 1000 nm. The insulator layer 102 can be formed by any suitable process such as thermal oxidation, thermal nitridation, chemical vapor deposition (CVD).

Figure 2:
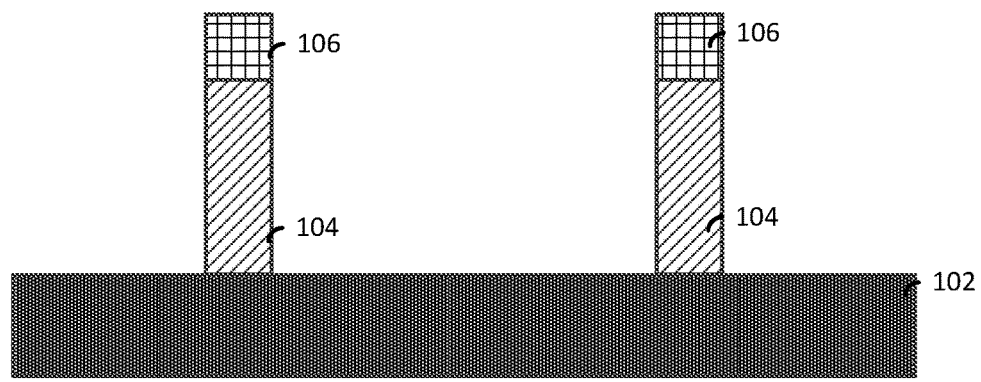
Figure 3:
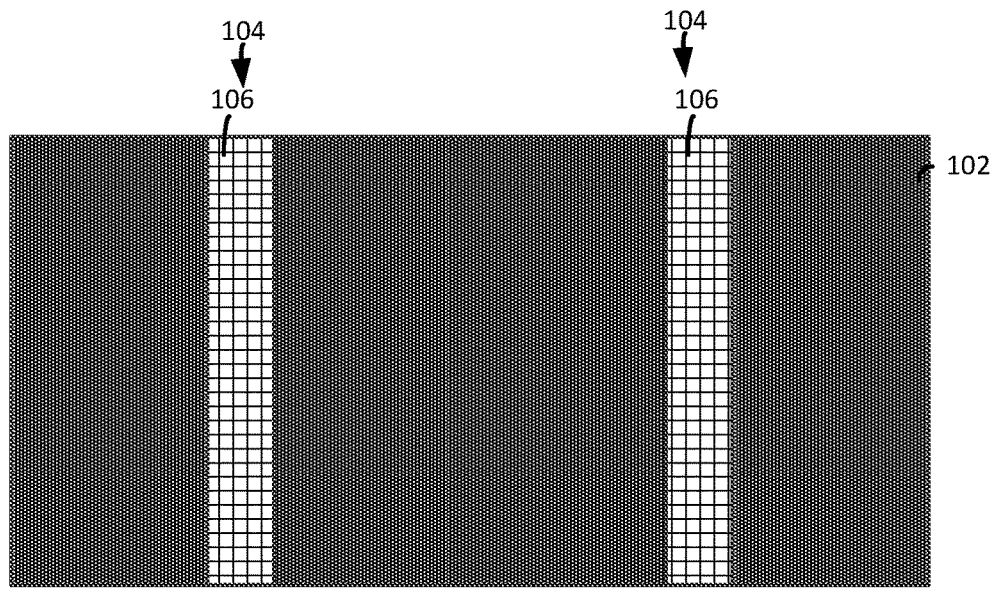

FIG. 2 illustrates a side view following the formation of fins 104 on the insulator layer 102. The fins 104 may be patterned by, for example, a lithographic patterning and etching process such as, reactive ion etching (RIE) or a sidewall imaging transfer process that removes exposed portions of the hardmask layer 106 and portions of the semiconductor substrate 103 to expose portions of the insulator layer 102. FIG. 3 illustrates a top view of the fins 104 arranged on the insulator layer 102.

Figure 4:
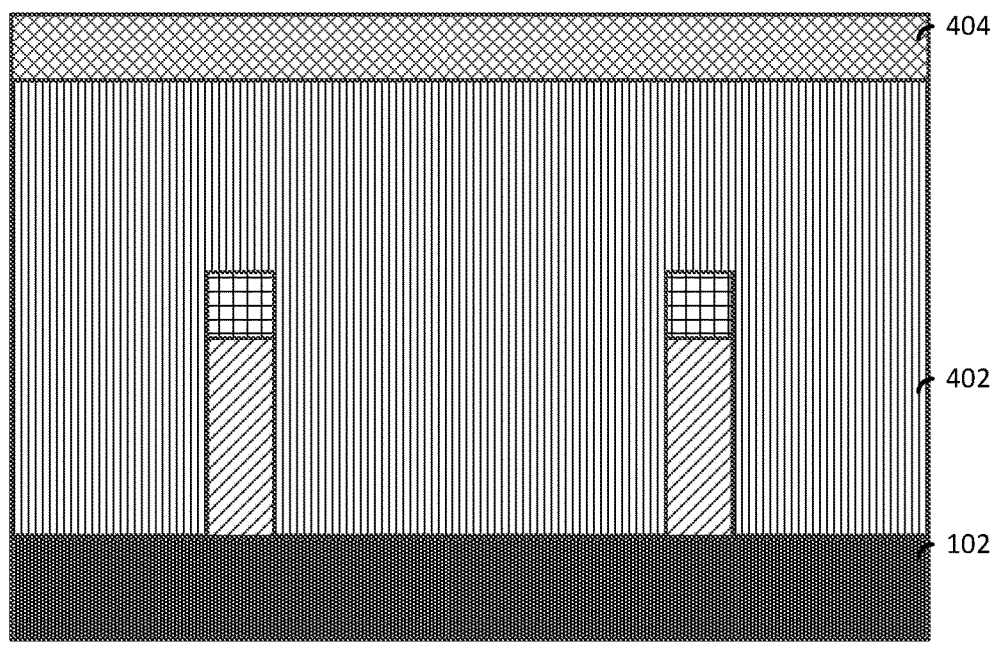

FIG. 4 illustrates a side view following the formation of a sacrificial (dummy) gates 402 over portions of the fins 104. The sacrificial gates 402 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 402 may further comprises a sacrificial gate dielectric material such as silicon oxide between the nanowires and aSi or polysilicon material.

The layer sacrificial gate material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 404. The hardmask layer may be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching is performed to remove exposed portions of the hardmask layer and the layer of sacrificial gate material form the sacrificial gates 402 and the sacrificial gate caps 404.

Figure 5:
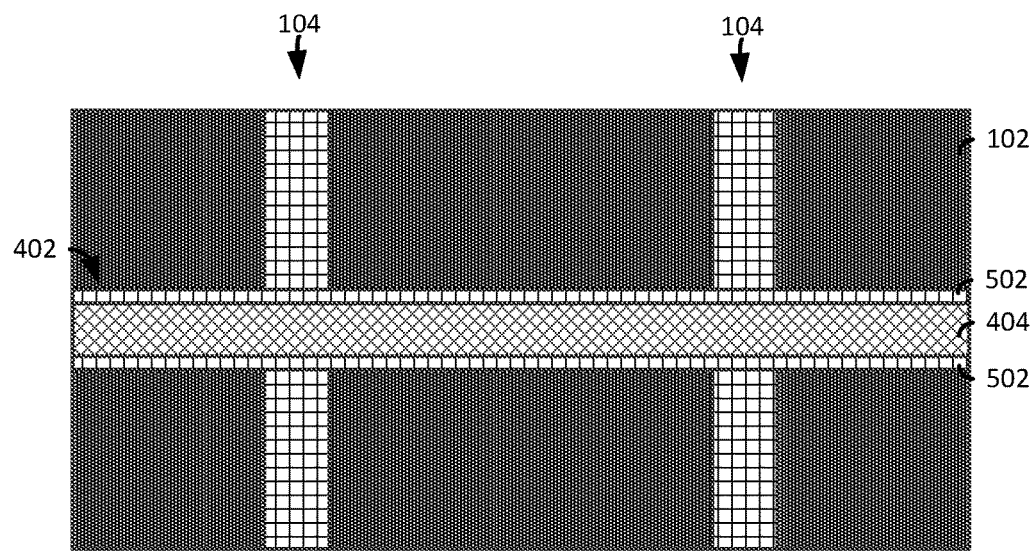

FIG. 5 illustrates a top view following the formation of spacers 502 adjacent to the sacrificial gates 402. The spacers 502 in the illustrated embodiment are formed by depositing a layer of spacer material (not shown) over the exposed portions of the insulator layer 102, the fins 104, and the sacrificial gates 402. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 502.

Figure 6:
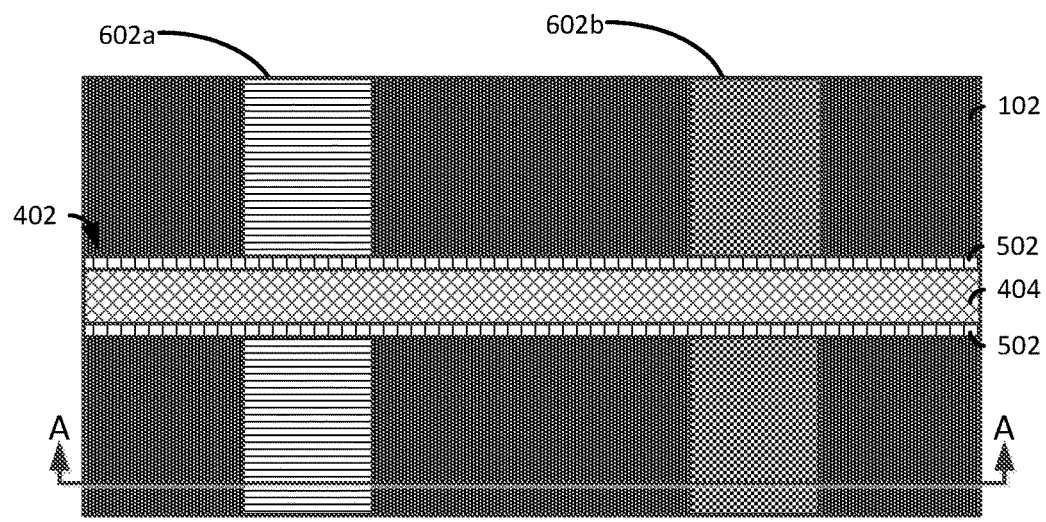

FIG. 6 illustrates a top view of the resultant structure following the formation of source/drain regions 602a and 602b. The source/drain regions 602a and 602b are formed by an epitaxial growth process that deposits a crystalline over layer of semiconductor material onto the exposed crystalline seed material of the exposed fin 104 to form the source/drain regions 602a and 602b.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ to $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 7:
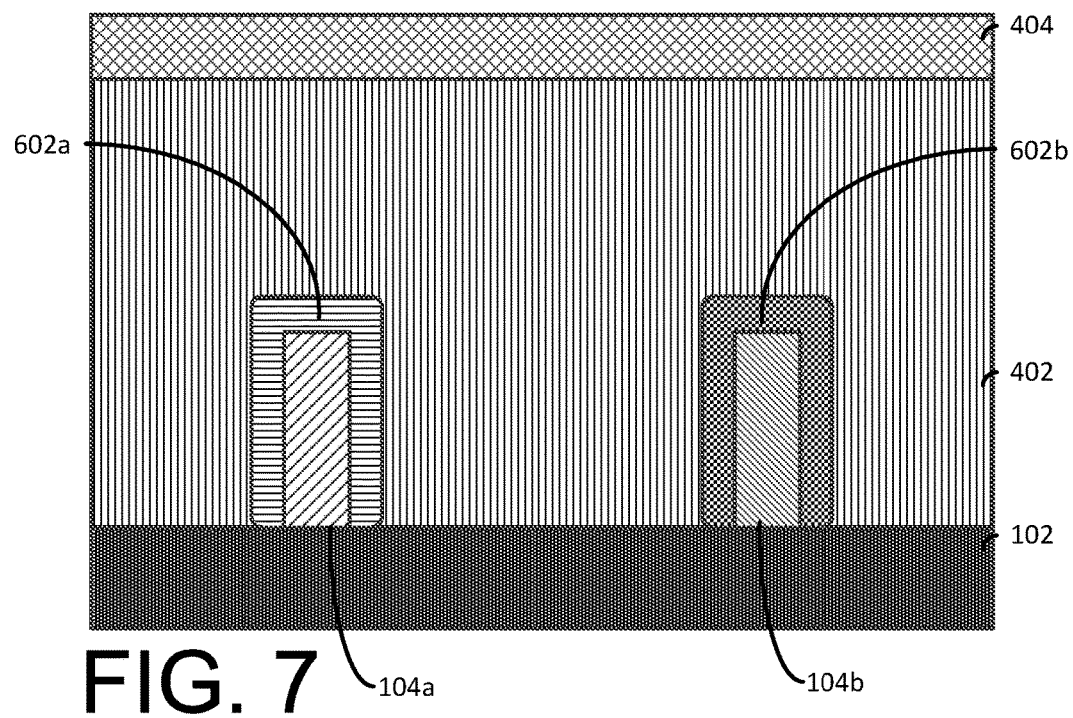

FIG. 7 illustrates a partially cut-away view along the line A-A (of FIG. 6) of the source/drain regions 602 and the fins 104. In the illustrated embodiment, an annealing process has been performed to drive atoms from the source/drain region 602b into the fin 104b. In the illustrated embodiment the source/drain region 602b includes a germanium or SiGe material that is dissimilar from the material of the source/drain region 602a. This results in a fin 104b comprising different materials than the fin 104a. Other suitable methods may be used to form fins having dissimilar materials if desired. Though the illustrated exemplary embodiments include fins 104b having dissimilar materials than the fins 104a, in some exemplary embodiments, the fins 104a and 104b may be formed from similar materials.

Figure 8:
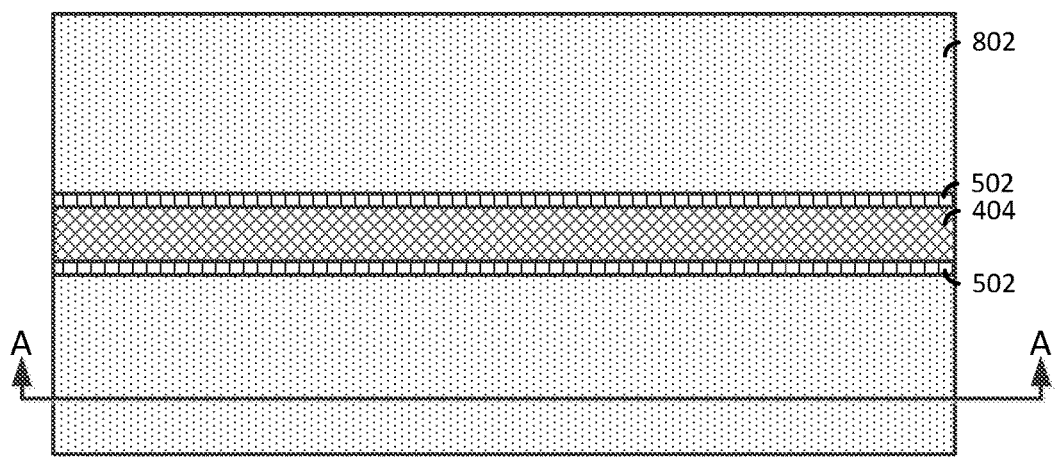

FIG. 8 illustrates a top view following the formation of an inter-level dielectric layer (ILD) 802. The inter-level dielectric layer 802 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 802 is deposited by a deposition process, including, but not limited to CVD, PVD, plasma enhanced CVD, atomic layer deposition (ALD), evaporation, chemical solution deposition, or like processes. Following the deposition of the inter-level dielectric layer 802, a planarization process such as, for example, chemical mechanical polishing is performed.

Figure 9:
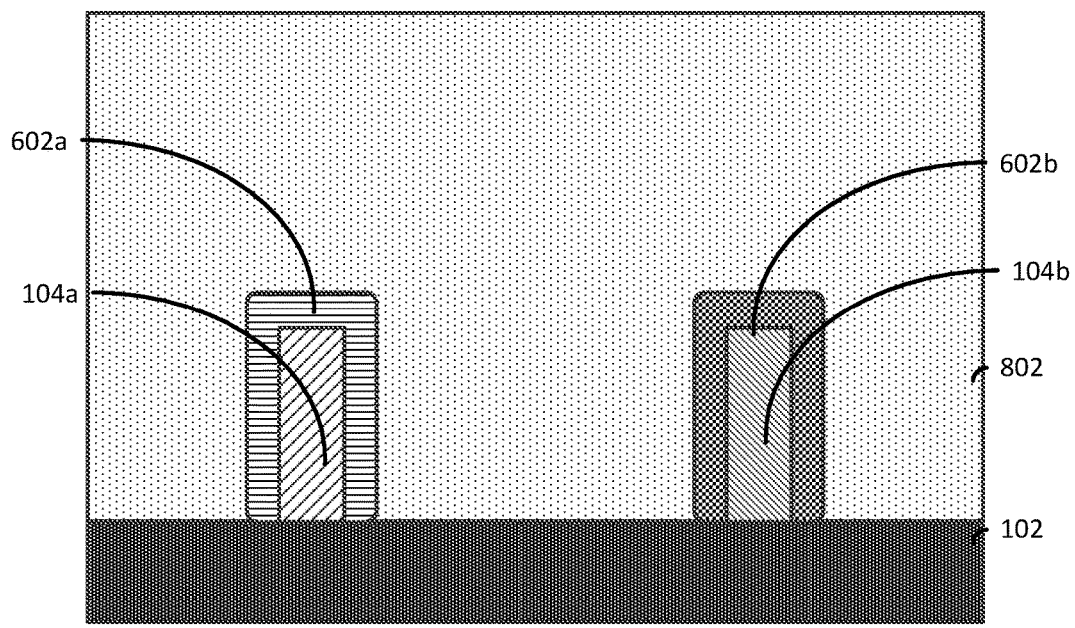

FIG. 9 illustrates a cut-away view along the line A-A (of FIG. 8) showing the inter-level dielectric layer 802 arranged over portions of the insulator layer 102 and the source/drain regions 602a and 602b.

Figure 10:
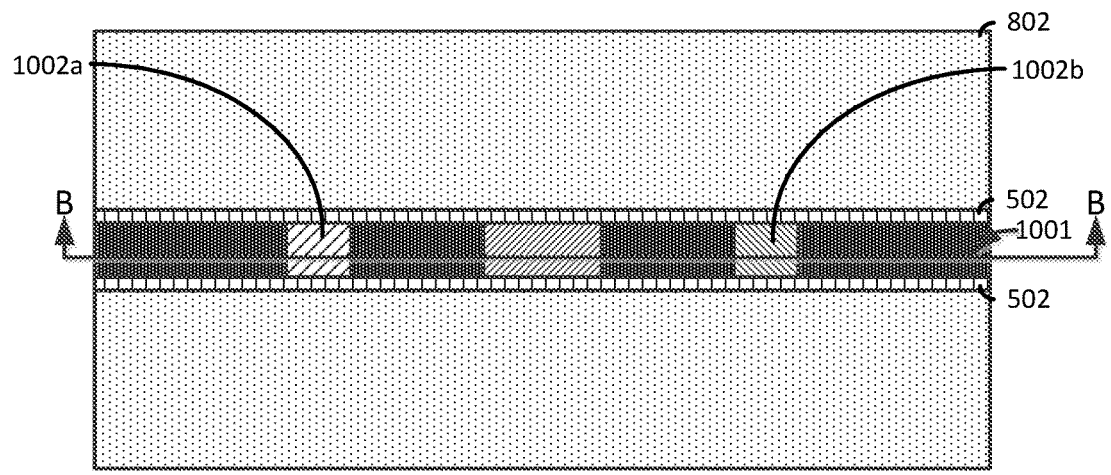

FIG. 10 illustrates a top view of the resultant structure following the removal of the sacrificial gates 402 (of FIG. 8) to form cavities 1001 that expose the channel regions 1002a and 1002b of the fins 104. The sacrificial gates 402 may be removed by performing a dry etch process, for example, RIE, followed by a wet etch process. The wet etch process is selective to (will not substantially etch) the spacers 502 and the inter-level dielectric material. The chemical etch process may include, but is not limited to, hot ammonia or tetramethylammonium hydroxide (TMAH).

Figure 11:

FIG. 11 illustrates a cut-away view along the line B-B (of FIG. 10) of the channel regions 1002a and 1002b following the removal of the sacrificial gates 402.

Figure 12:
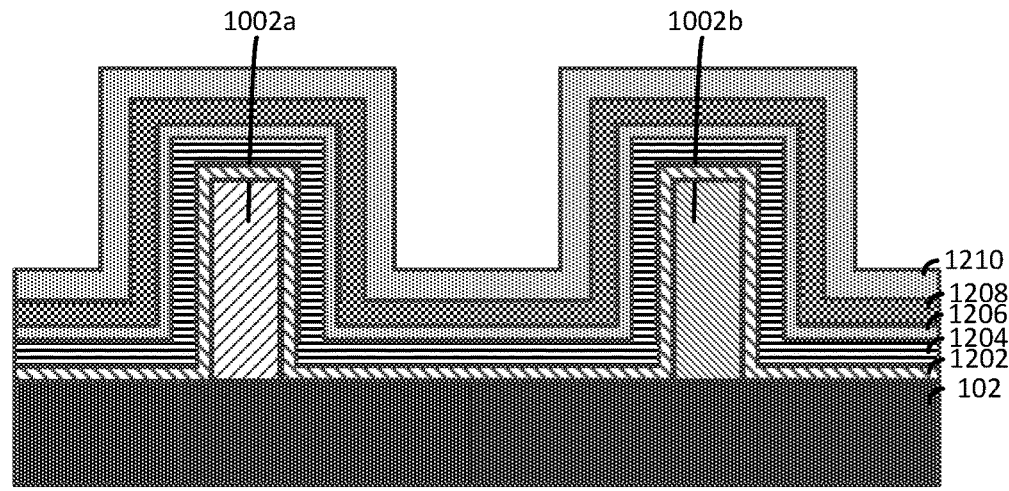

FIG. 12 illustrates a cut-away perpendicular to the longitudinal axis of the channel regions 1002a and 1002b following the deposition of replacement metal gate materials which will result in dissimilar replacement metal gate stacks (gate stacks) that will be described in further detail below.

In the illustrated exemplary embodiment, a first dielectric layer 1202 such as, for example, an oxide such as, for example, $SiO_2$ or $Si(O)N$ is deposited over the channel regions 1002a and 1002b. Following the deposition of the first dielectric layer 1202 a second dielectric layer 1204 is deposited over the first dielectric layer 1202. The second dielectric layer 1204 may include, for example, hafnium oxide. Collectively, the first dielectric layer 1202 and the second dielectric layer 1204 form a gate dielectric layer comprising gate dielectric material(s).

The gate dielectric materials can be dielectrics material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

Following the deposition of the gate dielectric materials, a first barrier layer 1206 is formed is formed over the gate dielectric materials. In the illustrated embodiment, the first barrier layer 1206 includes, for example, titanium nitride (TiN), or Tantalum nitride (TaN). The first barrier layer 1206 may be formed by, for example, atomic layer deposition, or chemical vapor deposition.

Once the first barrier layer 1206 is formed, a metal layer 1208 is formed over the first barrier layer 1206. The metal layer includes a conductive material such as, for example, $Al_2O_3$, $Al_2O_3$, TiAl, and TiAlC that may be deposited using, for example, Following the formation of the formation of the metal layer 1208 a cap layer 1210 is formed on the metal layer 1208. The cap layer 1210 may be similar to the first barrier layer 1206, and may include, for example, a TiN material.

Figure 13:
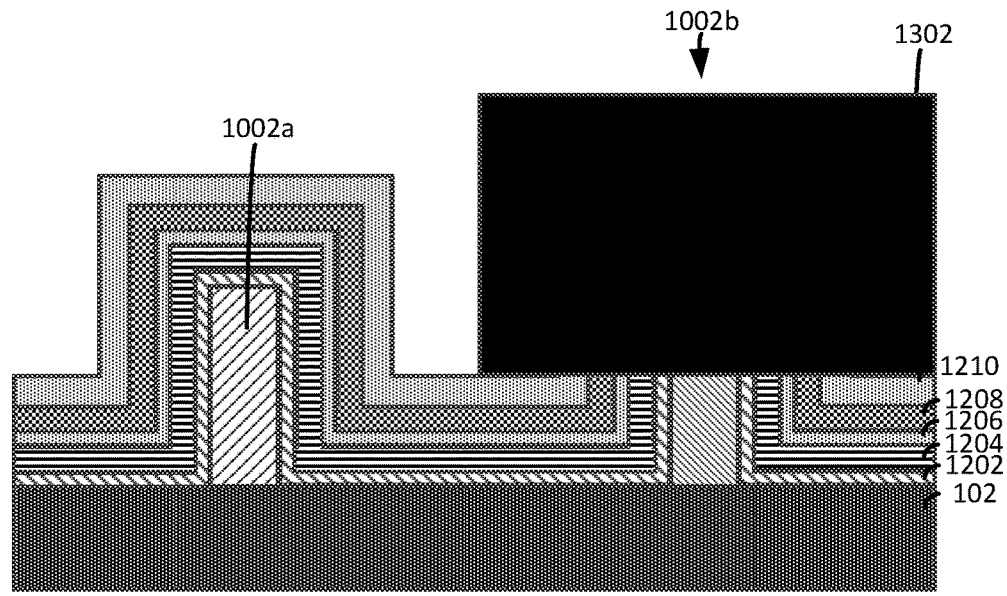

FIG. 13 illustrates a cut-away perpendicular to the longitudinal axis of the channel regions 1002a and 1002b following the patterning of a mask 1302 over the fin and portions of the cap layer 1210. The mask 1302 may be formed by, for example, a lithographic patterning process that forms the mask 1302. Suitable resist masks include photoresists, electron-beam resists, ion-beam resists, X-ray resists, and etch resists. The resist may a polymeric spin on material or a polymeric material.

Figure 14:
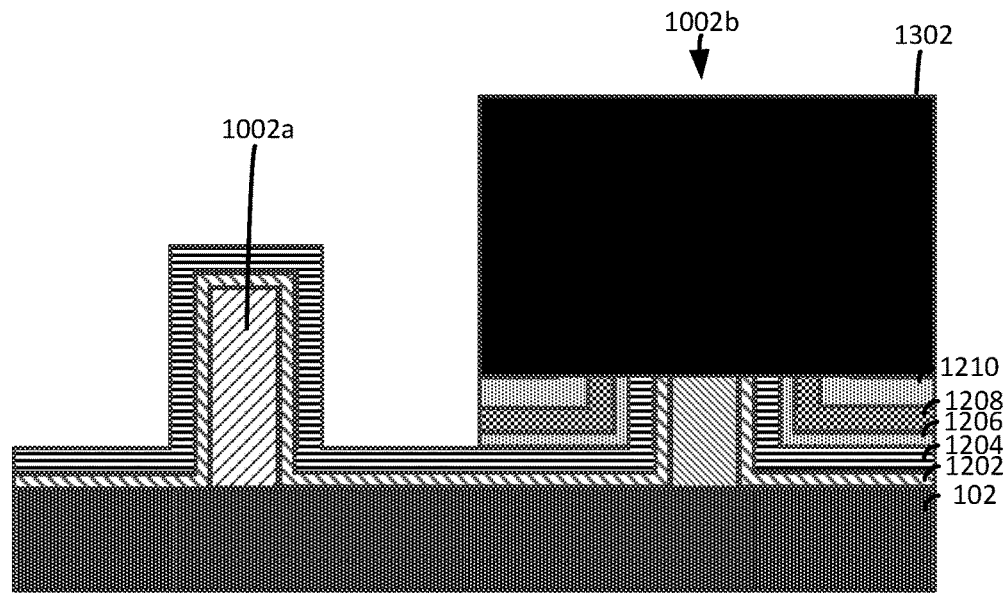

FIG. 14 illustrates a cut-away perpendicular to the longitudinal axis of the channel regions 1002a and 1002b following an etching process such as, for example, a wet etching process such as, $(NH_4OH+H_2O_2+H_2O)$ or $(HCl+H_2O_2+H_2O)$. The etching process removes exposed portions of the first barrier layer 1206, the metal layer 1208, and the cap layer 1210 over the channel 1002a. The etching process exposes the second dielectric layer 1204 over the channel region 1002a.

Figure 15:
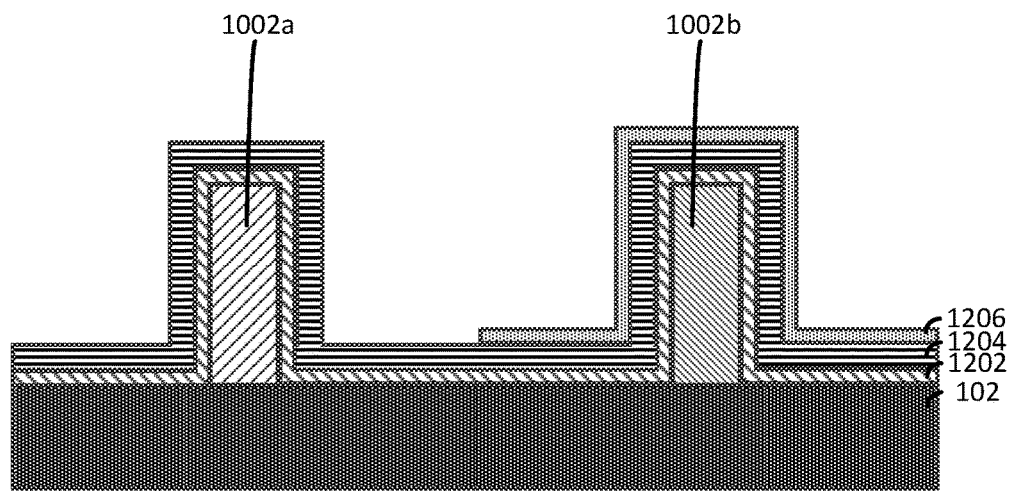

FIG. 15 illustrates a cut-away perpendicular to the longitudinal axis of the channel regions 1002a and 1002b following the removal of the mask 1302 and a selective etching process that removes exposed portions of the cap layer 1210, and the metal layer 1208 to expose the first barrier layer 1206 over the channel region 1002b. The selective etching process may include, for example, a wet etching process such as $(NH_4OH+H_2O_2+H_2O)$ to selectively remove exposed portions of the cap layer 1210 and HCl for selectively removing exposed portions of the metal layer 1208. An ashing process may be used to remove a photoresist material, amorphous carbon, or organic planarization (OPL) layer. Ashing is performed using a suitable reaction gas, for example, $O_2$, $N_2$, $H_2/N_2$, $O_3$, $CF_4$, or any combination thereof.

In the illustrated embodiment, the cap layer 1210 is operative to protect the metal layer during the selective etching process such that the etching process may selectively etch to remove the metal layer without substantially removing or substantially damaging the first barrier layer 1206.

Figure 16:
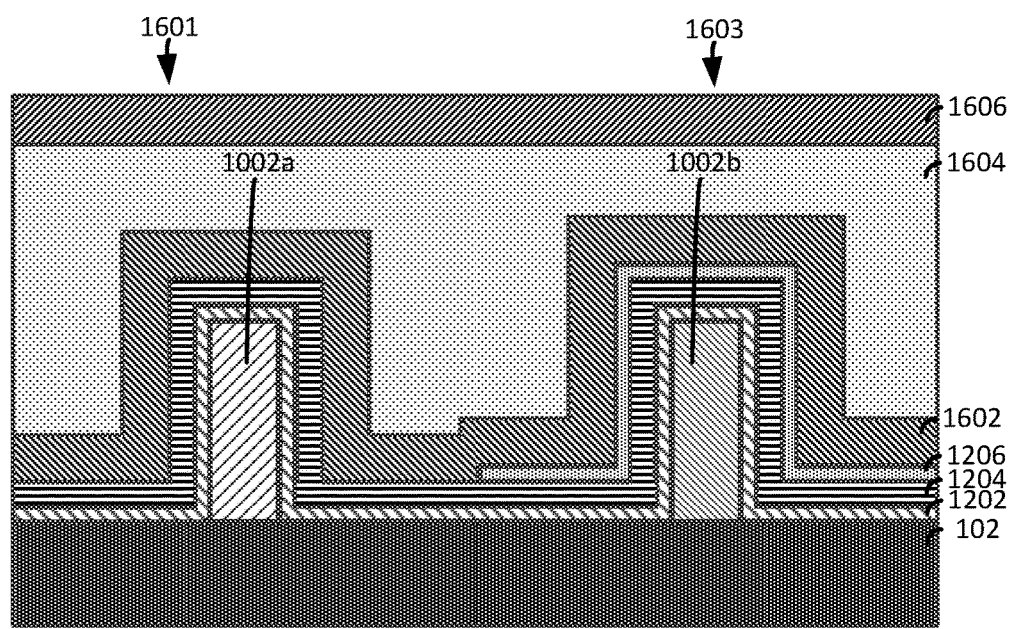

FIG. 16 illustrates a cut-away perpendicular to the longitudinal axis of the channel regions 1002a and 1002b following the deposition of a workfunction metal 1602 over exposed portions of the second dielectric layer 1204 over the channel region 1002a and over the first barrier layer 1206 over the channel region 1002b.

The type of work function metal(s) 1602 depends on the type of transistor and may differ between the nFET and pFET devices. Non-limiting examples of suitable work function metals 1602 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

Following the formation of the workfunction metal 1602 a gate conductor 1604 and gate cap 1606 are formed over the workfunction metal 1602 to form gate stacks 1601 and 1603. The gate stacks 1601 and 1603 are formed from dissimilar materials. Non-limiting examples of suitable conductive metals include aluminum (Al), platinum (Pt), gold (Au), tungsten (W), titanium (Ti), or any combination thereof. The gate conductor 1604 material(s) may be deposited by a suitable deposition process, for example, CVD, PECVD, PVD, plating, thermal or e-beam evaporation, and sputtering.

Following the deposition of the work function metal(s) 1602, and the gate conductor 1604 material(s), a planarization process, for example, chemical mechanical planarization (CMP), is performed to remove the overburden of the deposited gate materials and form the gate stacks 1601 and 1603.

Figure 17:
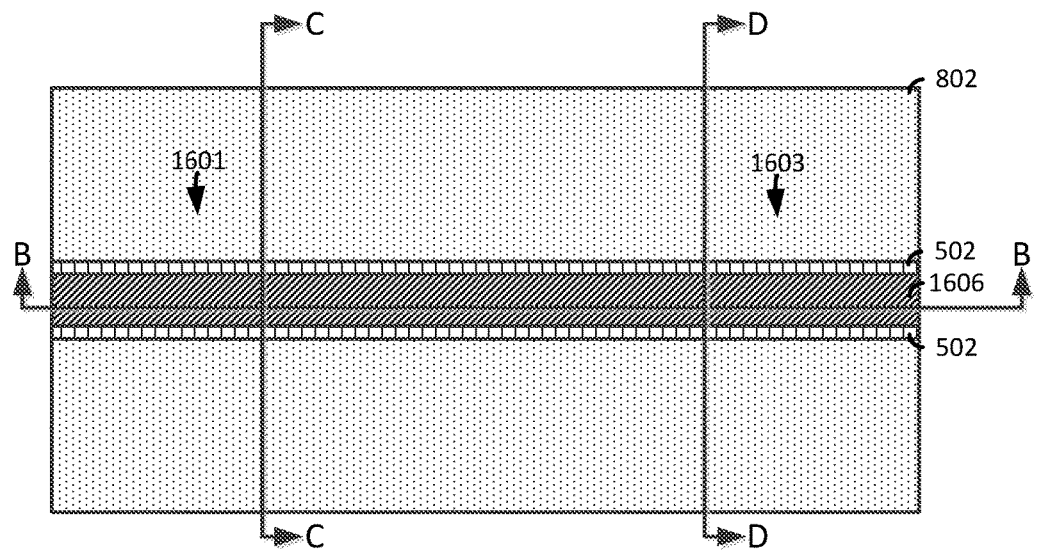

FIG. 17 illustrates a top view following the formation of the replacement metal gate stacks 1601 and 1603.

Figure 18:
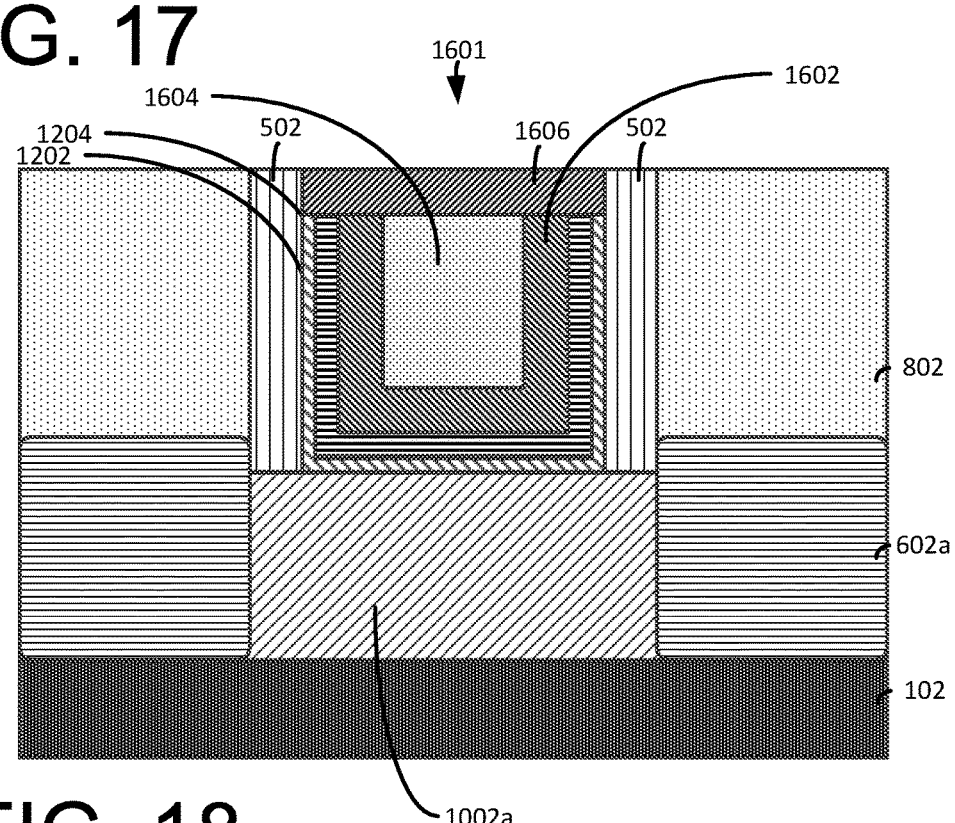
Figure 19:
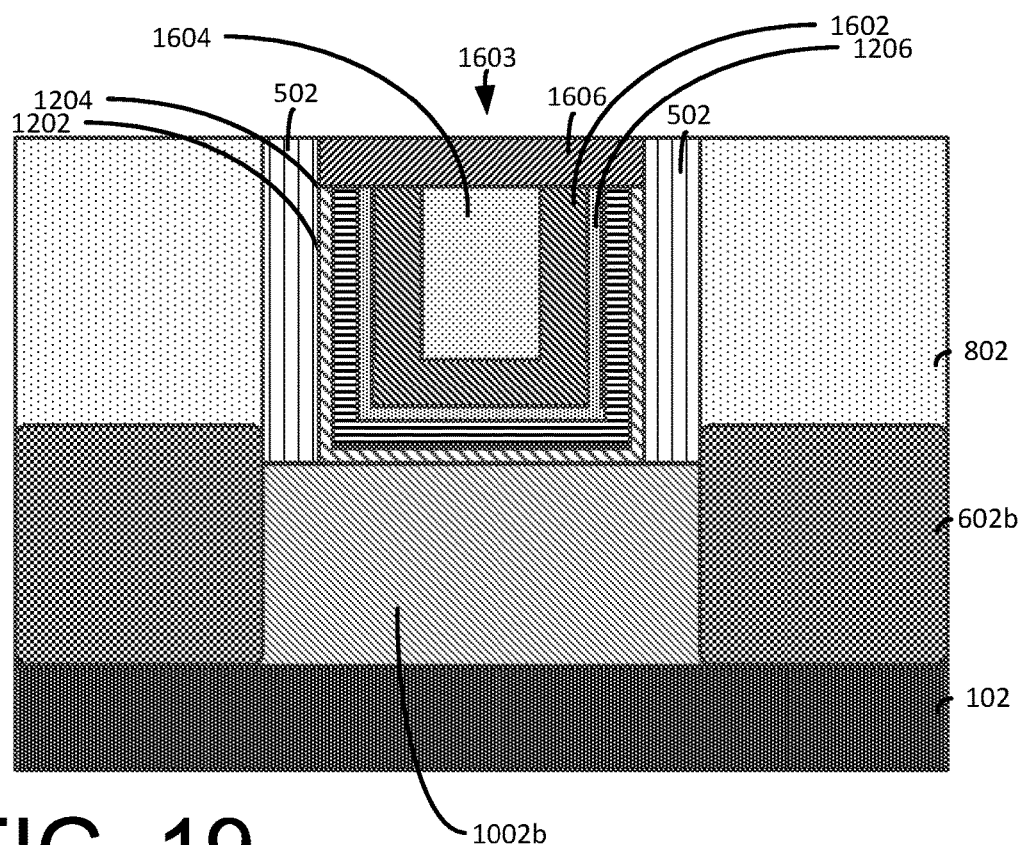

FIG. 18 illustrates a cut-away view along the line C-C (of FIG. 17). FIG. 19 illustrates a cut-away view along the line D-D (of FIG. 17). In this regard, the gate conductor 1604 of FIG. 18 has sufficient width and is not substantially "pinched" to an undesirably shorter width, which may degrade the performance of FET devices.

FIGS. 20-27 illustrate an alternate method for fabricating an exemplary multi-gate FET device.

Figure 20:
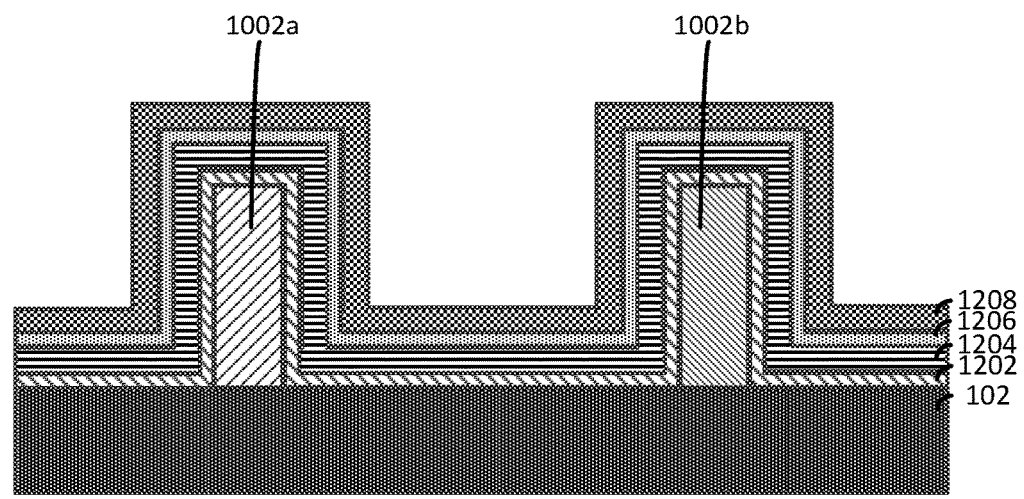
FIGS. 20-27 illustrate an alternate method for fabricating an exemplary multi-gate FET device.

In this regard, FIG. 20 illustrates a cut-away perpendicular to the longitudinal axis of the channel regions 1002a and 1002b that is similar to FIG. 12 described above and includes the insulator layer 102, a first dielectric layer 1202, the second dielectric layer 1204, first barrier layer 1206, and the metal layer 1208 arranged over the channel regions 1002a and 1002b.

Figure 21:
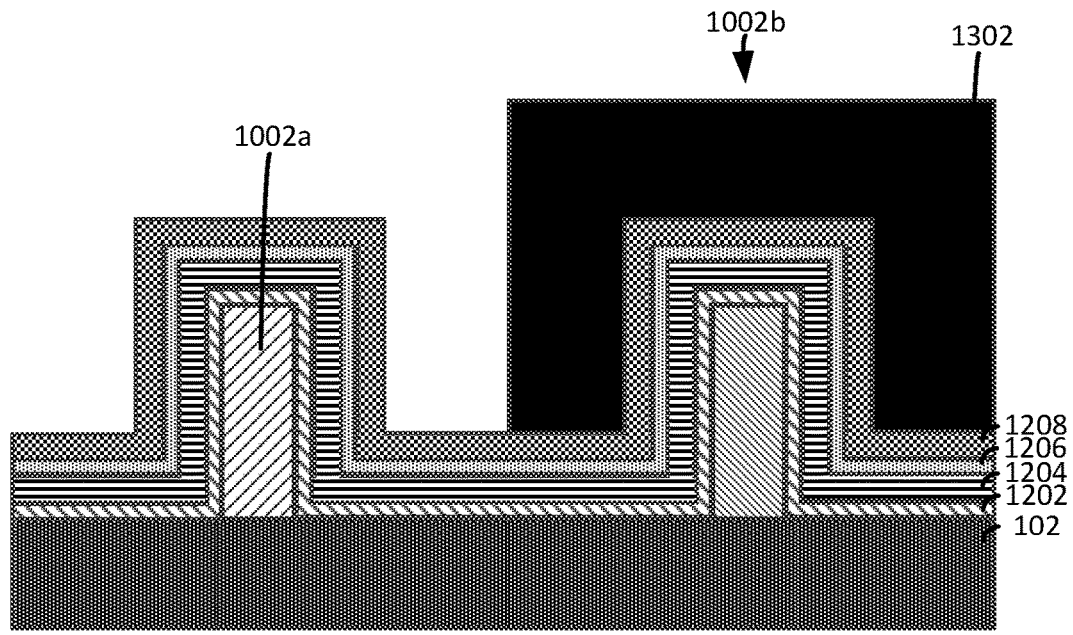

FIG. 21 illustrates a cut-away perpendicular to the longitudinal axis of the channel regions 1002a and 1002b following the patterning of a mask 1302 over the fin and portions of the using a mask patterning process similar to the processes described above.

Figure 22:
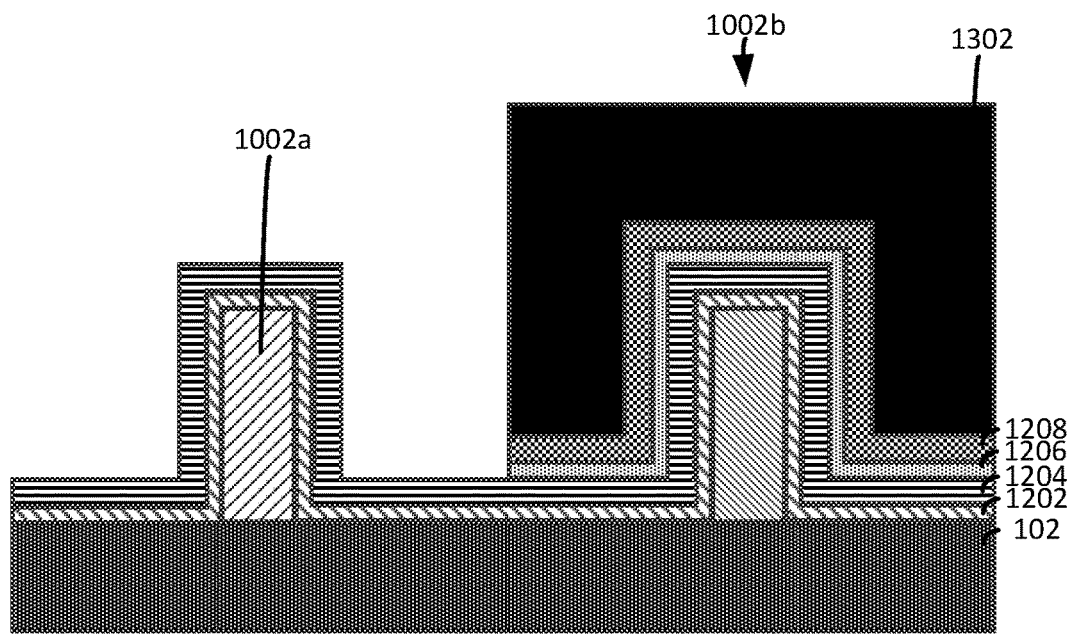

FIG. 22 illustrates a cut-away perpendicular to the longitudinal axis of the channel regions 1002a and 1002b following an etching process that removes exposed portions of the metal layer 1208 and the first barrier layer 1206 over the channel region 1002a and exposes the second dielectric layer 1204 over the channel region 1002a.

Figure 23:
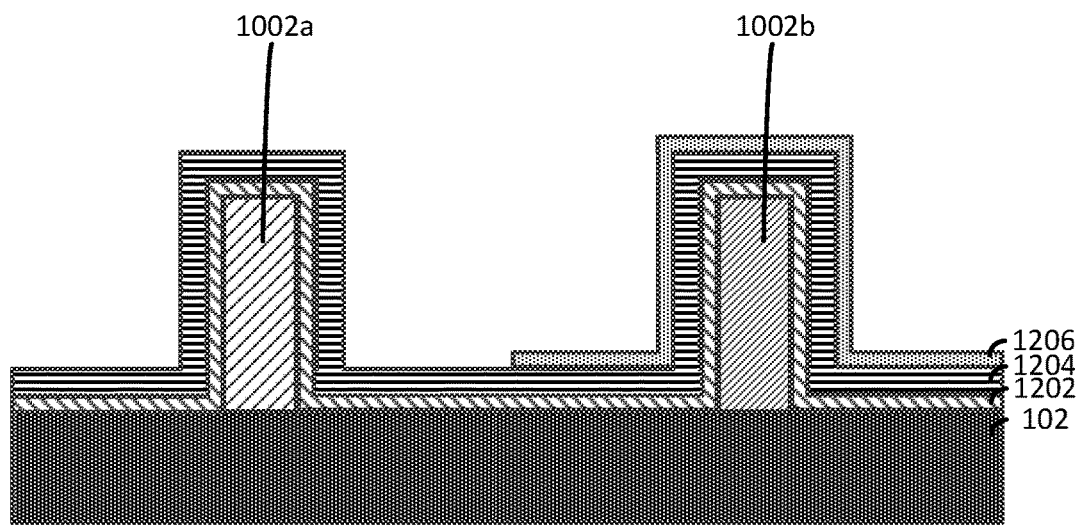

FIG. 23 illustrates a cut-away perpendicular to the longitudinal axis of the channel regions 1002a and 1002b following the removal of the mask 1302 using a suitable process such as, for example, ashing.

Figure 24:
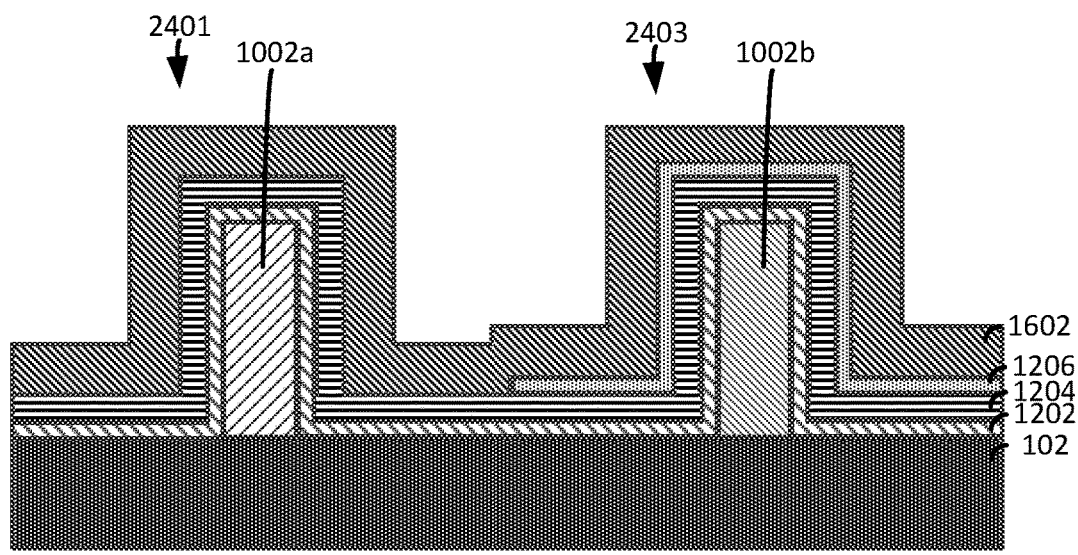

FIG. 24 illustrates a cut-away perpendicular to the longitudinal axis of the channel regions 1002a and 1002b following the deposition of the workfunction metal 1602 over exposed portions of the second dielectric layer 1204 over the channel region 1002a and over the first barrier layer 1206 over the channel region 1002b.

Figure 25:
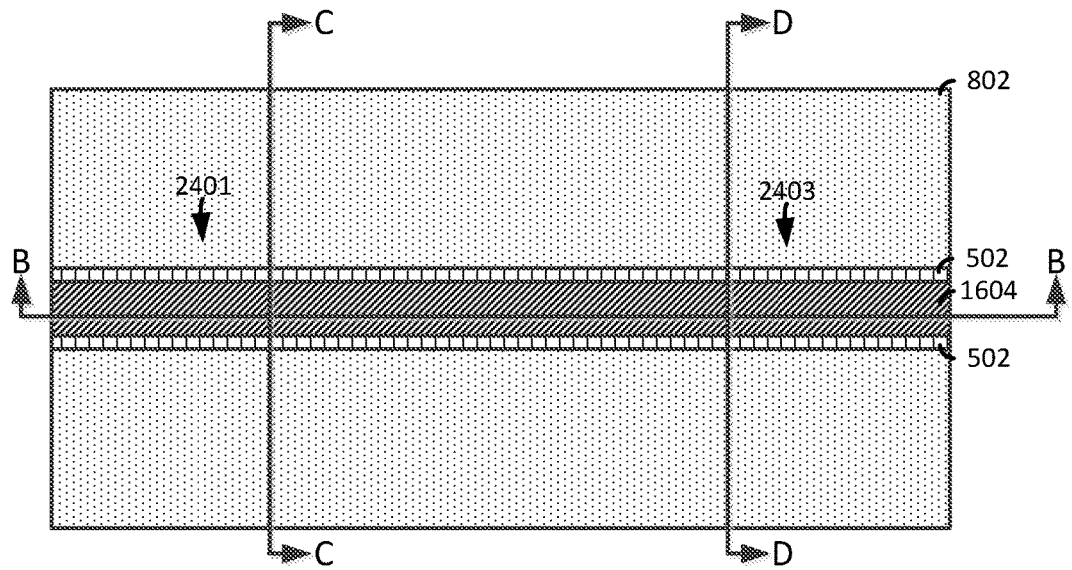

FIG. 25 illustrates a top view following the formation of the replacement metal gate stacks 2401 and 2403.

Figure 26:
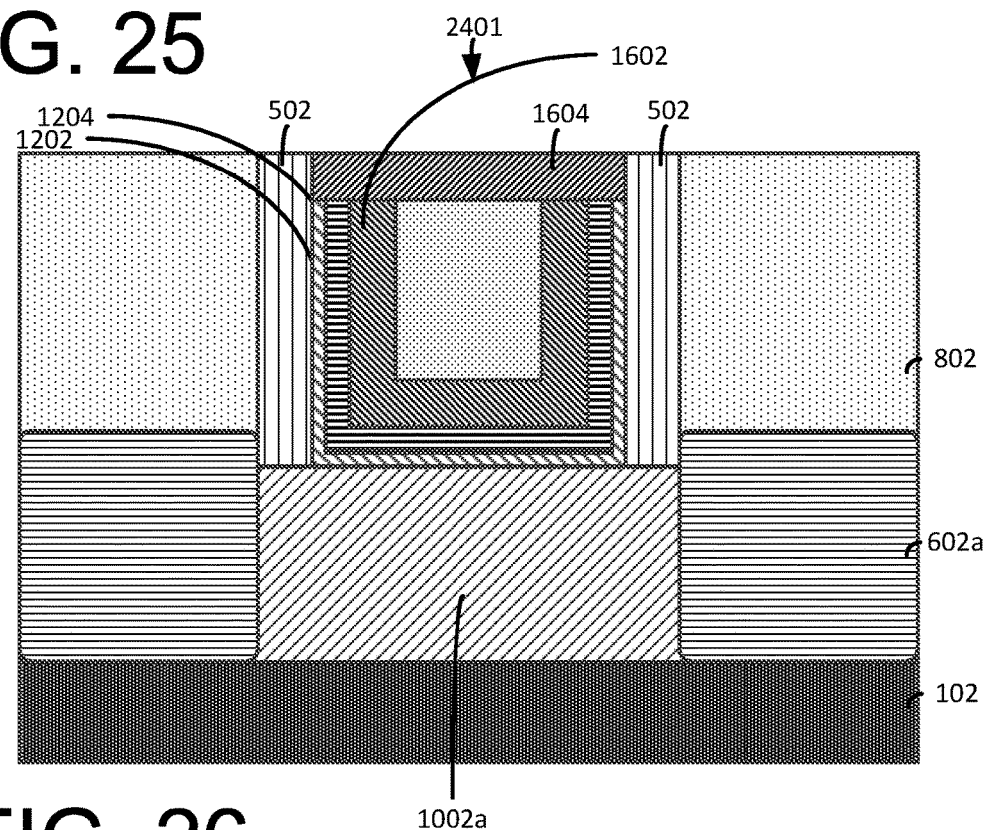
Figure 27:
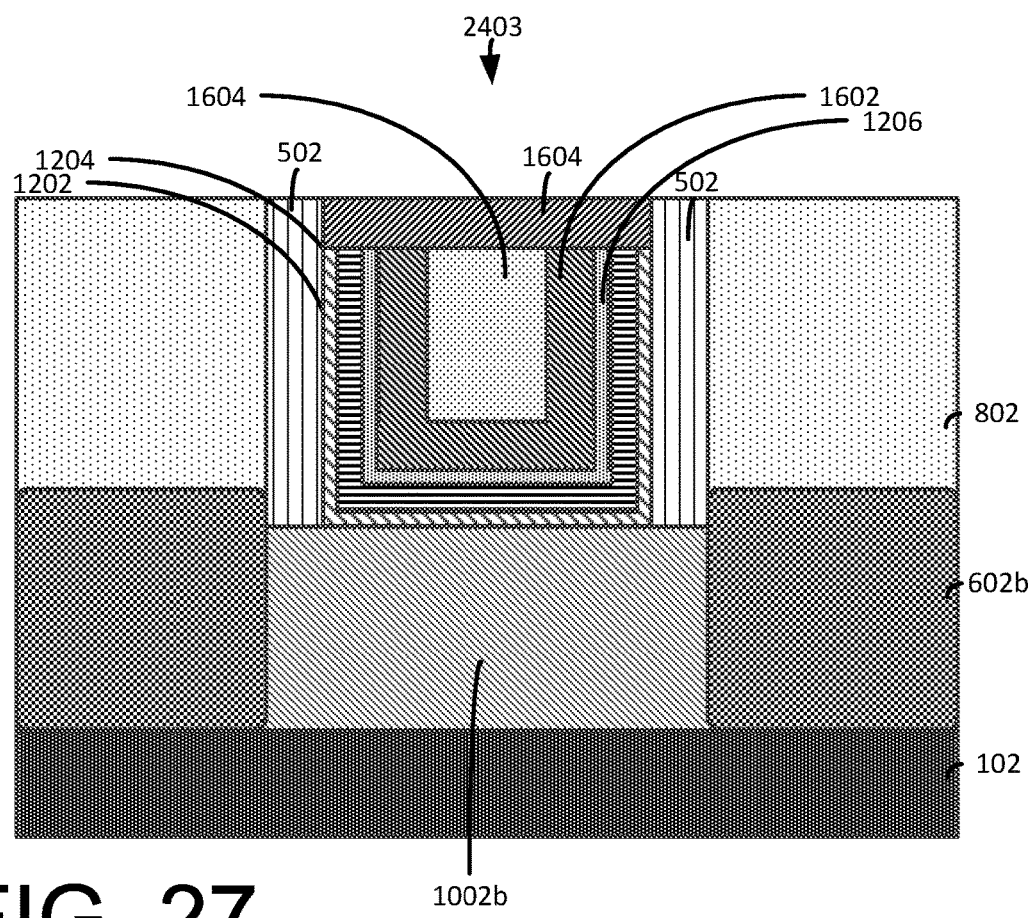

FIG. 26 illustrates a cut-away view along the line C-C (of FIG. 25). FIG. 27 illustrates a cut-away view along the line D-D (of FIG. 25). In this regard, the gate conductor 1604 of FIG. 26 has sufficient width and is not substantially "pinched" to an undesirably shorter width, which may degrade the performance of FET devices.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:

forming, on an insulator layer, a first channel region with a fin extending vertically upwardly from the insulator layer and a second channel region with a fin extending upwardly from the insulator layer, the fin of the second channel region including a different material than the fin of the first channel region;

depositing a dielectric material layer on the first channel region, the second channel region and a portion of the insulator layer between the fin of the first channel region and the fin of the second channel region;

depositing a barrier layer on the dielectric material layer on the first channel region, the second channel region and the portion of the insulator layer;

depositing a metal layer on the barrier layer on the first channel region, the second channel region and the portion of the insulator layer;

patterning a mask in contact with a portion of the metal layer in the second channel region and a first sub-portion of the portion of the insulator layer proximate to the fin of the second channel region;

removing a portion of the metal layer and the barrier layer on the first channel region and a second sub-portion of the portion of the insulator layer proximate to the fin of the first channel region;

after removing the portion of the metal layer and the barrier layer, removing an entirety of the metal layer on the second channel region and the first sub-portion of the portion of the insulator layer proximate to the fin of the second channel region to expose the barrier layer on the second channel region and the first sub-portion of the portion of the insulator layer proximate to the fin of the second channel region; and depositing a layer of workfunction material on an exposed portion of the dielectric material layer on the first channel region and the second sub-portion of the portion of the insulator layer proximate to the fin of the first channel region and over the barrier layer on the second channel region and the first sub-portion of the portion of the insulator layer proximate to the fin of the second channel region.

2. The method of claim 1, wherein the second channel region includes germanium.

3. The method of claim 2, wherein depositing the layer of workfunction material on the exposed portion of the dielectric material layer on the first channel region and over the barrier layer on the second channel region includes depositing the layer of workfunction material directly on an exposed portion of the dielectric material layer on the first channel region and directly over the barrier layer on the second channel region.

* * * * *